United States Patent [19]

von Schnering et al.

[11] Patent Number: 4,990,488

[45] Date of Patent: Feb. 5, 1991

[54] SUPERCONDUCTORS BI-SR-CU-O

[75] Inventors: Hans-Georg von Schnering, Aidlingen; Winfried Becker, Kelkheim; Martin Schwarz, Königstein/Taunus; Leonhard Walz, Rastatt; Elfi Waldschmidt, Bad Camberg; Joachim Adam, Butzbach, all of Fed. Rep. of Germany

[73] Assignee: Hoechst Aktiengesellschaft, Frankfurt am Main, Fed. Rep. of Germany

[21] Appl. No.: 275,779

[22] Filed: Nov. 23, 1988

[30] Foreign Application Priority Data

Nov. 25, 1987 [DE] Fed. Rep. of Germany ....... 3739886

[51] Int. Cl.$^5$ .................... C01F 11/02; C01G 3/02; C01G 29/00
[52] U.S. Cl. ........................ 505/1; 252/521; 423/604; 423/617; 423/635; 501/123; 505/782
[58] Field of Search ...................... 501/123; 252/521; 423/604, 627, 635; 505/1, 782

[56] References Cited

FOREIGN PATENT DOCUMENTS 0281474 9/1988 European Pat. Off. .
0287810 10/1988 European Pat. Off. .

OTHER PUBLICATIONS

C. Michel et al., "Superconductivity in the Bi-Sr-Cu-O System", Z. Phys. B. 68, 421-423 (1987).

Primary Examiner—Paul Lieberman
Assistant Examiner—John Boyd

[57] ABSTRACT

Black crystal compositions having the empirical composition $Bi_aSr_bCu_cO_d$ are described where $a+b+c=1$, $A=0.36-0.557$, $b=0.098-0.496$, $c=0.1-0.4$ and $d=$ approximately $1+a/2$. These compositions have a superconducting transition temperature $T_c$ for superconductivity of greater than 20 K and contain a principal phase which crystallizes in the orthorhombic system. They can be prepared from the mixture of the oxides in the atomic ratio stated by heating to 700°-1000° C.

5 Claims, No Drawings

SUPERCONDUCTORS BI-SR-CU-O

DESCRIPTION

The present invention relates to substances based on bismuth, strontium and copper which are superconducting at relatively high temperatures.

Whereas conventional superconducting materials can be employed exclusively at very low temperatures, requiring the use of the very expensive coolant helium, the novel superconducting oxidic substances operate at essentially higher temperatures, which can be achieved using the comparatively inexpensive coolant nitrogen. This reduces the operating costs of superconducting equipment and plants and opens up an extensive range of novel possible applications.

An essential disadvantage of many novel oxidic superconductors is, however, that they contain as a common component La or Y or rare earth metals, such as, for example, Sm, Lu, Ho or Eu. Some of these metals are only available in small amounts and, due to their complex recovery, are expensive. Disadvantages therefore arise for the preparation of large amounts of oxidic superconductors due to the high raw materials prices and the limited resources of rare earth metals.

An oxidic superconductor having a superconducting transition temperature of 20° K. which contains, in oxidic form, the elements bismuth, strontium and copper in the atomic ratio 1:1:1 has already been disclosed (C. Michel et al., Z. Phys. B 68 (1987) 421). However, a superconducting transition temperature of about 20K is still unsatisfactory for industrial purposes.

The object was therefore, to provide novel superconducting oxidic substances which do not contain any rare-earth metals or lanthanum or yttrium and whose superconducting transition temperature is significantly above 20K.

The invention is based on the knowledge that the superconducting transition temperature in the three-component system comprising the oxides of B,, Sr and Cu is favorably affected if the Bi: (Bi+Cu+Sr) atomic ratio in the oxidized substances is about 0.36–0.56.

Novel superconducting substances, described in greater detail in claim 1 have now been found. They comprise the metals strontium, copper and bismuth, which they contain in oxidized form. The strontium content is 9.8 to 49.6 atom-%, the bismuth content is 36–55.7 atom-% and the copper content is 10–40 atom-%.

The substances have a critical temperature (superconducting transition temperature) $T_c$ of greater than 20K and preferably at least 40K. There are black and their principal phases crystallize in the orthorhombic system.

The novel substances have the general empirical composition $Bi_aSr_bCu_cO_d$, where a+b+c=1,
a=0.36–0.557, in particular 0.37–0.46,
b=0.098–0.496, in particular 0.15–0.496,
c=0.1–0.4, and
d is approximately a/2+1.

In the substances, the oxygen content works out at somewhat more than for divalent copper and trivalent bismuth They therefore probably also contain $Cu^{+++}$ ions. At the pre-specified a, b and c, the highest possible oxygen content (d) is advantageous for superconductivity. In a particular embodiment of the invention, the (Bi+Sr):Cu atomic ratio is about 2. These substances have the general composition $Bi_{1.2+x}Sr_{0.8-x}Cu_{1+k}O_e$ where k denotes a number between −0.05 and +0.05, but preferably denotes 0,
x represents a number between 0 and 0.7 and
e denotes approximately $3.6+k+x/2$.

Preferred values for x are 0 to 0.4, in particular 0 to 0.1.

In a further particular embodiment of the invention the (Sr+Cu):Bi atomic ratio is about 1.5. These substances have the general composition $Bi_2Sr_yCu_{3-y+k}O_f$ where k denotes a number between −0.05 and +0.05, preferably 0, and
y denotes a number between 1 and 2.5, preferably 1.33 and 2.25, in particular 1.5 and 2 and
f is approximately 6 +k.

The novel substances can be prepared by thoroughly mixing oxides or oxide precursors of the elements Bi, Sr and Cu, heating the mixture to temperatures of from 700° to 1100° C., and keeping in this temperature range for a relatively long period. During the reaction, the atomic ratio of the metals employed does not change as a first approximation The atomic ratio used therefore corresponds to the oxide composition intended.

Oxide precursors which can be used are generally compounds which react at the reaction temperature to form the corresponding oxides, in particular the hydroxides and nitrates. It is furthermore possible to use the acetates, formates, oxalates and carbonates of the metals mentioned, for example strontium carbonate, bismuthic acid, bismuth(III) oxide, bismuth(V) oxide, $Cu_2O$ and CuO.

The synthesis temperature is preferably in the range between 700° and 900° C., preferably 700° to 750° C. The reaction time should be at least 4 hours, still better at least 8 hours. The upper limit for the reaction time is set only by economic considerations. Reaction times of 100 or 120 hours are possible.

The actual reaction should occur in a non-reducing atmosphere. For example, air, pure oxygen and $O_2/Ar$ or $O_2/N_2$ mixtures can be used Preference is given to carrying out the reaction of the oxides in an oxygencontaining atmosphere The use of elevated oxygen pressures does not appear to offer any advantages.

As the reaction proceeds, the number of lines in the X-ray diffraction spectrum decreases. The reaction is complete when no further changes occur in the spectrum.

When the reaction is complete, the sample is either removed from the oven and cooled to room temperature in air or oxygen (rapidly) or slowly cooled to room temperature in the oven. High cooling rates have a favorable effect on the superconducting properties of the reaction product.

In order to ensure that the entire oxide mixture has reacted, it is advantageous to further comminute the powder obtained after cooling and to re-treat it thermally. During this aftertreatment, the temperature is in the range 300° to 900° C. Preferred lower limits for the aftertreatment temperature are at least 350° C., in particular 400° C., and a preferred upper limit is 750° C., better 600° C. in particular 550° C. The possible after-reaction should be carried out in air, pure oxygen or a gas mixture such as $O_2/Ar$ or $O_2/N_2$. Reaction vessels which can be used are commercially available crucibles or boats made from inert materials, such as, for example, aluminum oxide, zirconium, platinum and iridium. Suitable heat sources are commercially available furnaces, such as, for example, box, muffle or tubular furnaces.

A further process for the preparation of the superconducting substances comprises mixing salts of the metals mentioned in the presence of an aqueous phase, evaporating the water-containing salt mixture and conditioning the residue in the temperature range 700° to 1100° C., preferably 700° to 90° C. At least one of the salts employed should be water-soluble, and the salt should decompose in the temperature range indicated to form the oxides With respect to the reaction time, the same applies as when the oxides are used.

The salt mixture to be evaporated can also be prepared by dissolving the metal oxides in nitric acid and evaporating the nitric acid.

If water-soluble salts are employed, it is also possible to precipitate the metal hydroxides by adding a base, for example tetramethylammonium hydroxide. In this way, particularly thorough mixing of the starting materials is achieved The precipitated hydroxides can be separated off, dried, and then conditioned as specified above. It is preferred that no non-volatile cations are introduced through the base used and no non-volatile anions through the salts employed In this embodiment of the process according to the invention too, the atomic ratio of the metal salts employed corresponds to the atomic ratio intended in the final product. The oxidic products prepared from the salts can likewise be thermally aftertreated as described above.

Crystals of $Cu_2O$ (red) and $CuO$ (needles) can be removed under a microscope from the black crystal composition according to the invention after melting, cooling and grinding A black composition remains, from which black plate-like crystals can be isolated by hand under a microscope.

As shown by the X-ray structural analysis of these monocrystals, this principal phase has the composition $Cu_4Bi_8Sr_8O_z$, whose structure has an alternating arrangement of parallel layers (001). One layer is formed by $CuO_6$ octahedra, which are linked at the corners in similar fashion to a perovskite. The second layer is built up from oxygen and bismuth atoms. In this layer, the oxygen atoms form a 2-dimensionally infinite network of squares linked at the edges. The bismuth atoms are arranged in alternating fashion above and below the centers of the squares.

Surprisingly, superconducting substances are obtained in the process according to the invention from laboratory chemicals having a purity of only about 99.5%. However, chemicals having a purity of 99.8% may be used.

The superconducting substances obtained can be used in power engineering (for cables and wires, transformers and energy stores in the form of current-carrying coils), in magnet technology (for example for nuclear-spin tomographs and for the production of retaining magnets for magnetic levitation trains), in computer technology (thin layers, connections on printed circuit boards, Josephson switching elements), and for electronic components (detectors, antennae, transistors, electronic sensors, for example SQUIDs, galvanometers, modulators, bolometers and SLUGs). The use of superconductivity in metrology is dealt with in the paper of the same name by Prof. F. Baumann, Karlsruhe, in a series of papers in VDI-Bildungswerks (1976).

The invention is described in greater detail by the examples.

EXAMPLE 1

8 mol of $SrCO_3$, 6 mol of $Bi_2O_3$ and 10 mol of $CuO$ are comminuted in an agate mortar, mixed thoroughly and transferred into an $Al_2O_3$ crucible. The sample is rapidly heated in air in a suitable laboratory furnace to 700° C., kept at this temperature for 100 hours and subsequently cooled rapidly to room temperature. The baked powder is comminuted and tableted under a pressure of about 300 MPa (3 kbar). The moldings are then conditioned for 10 hours at 700° C. under a pure oxygen atmosphere. The black material prepared in this way exhibited a superconducting transition temperature of 40K in measurements using a SQUID or superconducting quantum interference device. From the strength of the Meissner effect, it can be concluded that the phase having the superconducting transition temperature of 40K makes up less than 50% by volume. According to X-ray diffraction studies, the grating constants are: $5.397 \times 10^{-10}$ m, $b = 5.384 \times 10^{-10}$ m and $c = 24.415 \times 10 - 10$ m.

The X-ray diffraction spectrum (irradiation source: copper $K_\alpha$ $1.54056 \times 10^{-10}$ m) exhibits lines at the following d values 4.083; 3.477; 3.066; 3.025; 2.712; 2.026; 1.922; 1.913; 1.802; 1.770; 1.688; 1.672; 1.614; 1.507×$10^{-10}$ m.

EXAMPLE 2

2 mol of SrO (99.5%, Messrs. Alfa), 1 mol of $Bi_2O_3$ (99.8%, Messrs. Ventron) and 1 mol of CuO (99.0%, Messrs. Riedel de Haen) are comminuted in an agate mortar, mixed thoroughly and transferred into an $Al_2O_3$ crucible. The sample is heated in air for 2 hours at 800° C., kept at this temperature for 7 hours and subsequently removed from the furnace (at 800° C.). The baked powder is comminuted after cooling and tableted under a pressure of about 3 kbar. The tablets are then heated again in air for 1 hour at 800° C., kept at this temperature for 7 hours and subsequently removed from the oven. The material prepared in this way exhibited a transition into the superconducting state at $T_c = 40K$ in four-point conductivity measurements and a superconducting transition temperature of 52K according to study of the Meissner effect. From the strength of the Meissner effect, it can be concluded that the phase having the superconducting transition temperature of 40K makes up less than 50% by volume.

The density of the black crystal composition is 6.48 g/cm$_3$ (pycnometer).

The X-ray diffraction spectrum (powder diagram of a crystal composition) can be seen from Table 1.

| NO | 2THETA | D | INTEG.I (%) | NO | 2THETA | D | INTEG.I (%) |
| --- | --- | --- | --- | --- | --- | --- | --- |
| 1 | 4.776 | 16.5011 | 0.6 | 34 | 40.309 | 2.2374 | 2.0 |
| 2 | 7.196 | 12.2644 | 2.7 | 35 | 41.113 | 2.1955 | 5.1 |
| 3 | 9.196 | 9.6169 | 18.4 | 36 | 41.617 | 2.1700 | 14.2 |
| 4 | 12.337 | 7.1742 | 13.4 | 37 | 42.258 | 2.1386 | 16.6 |
| 5 | 13.386 | 6.6144 | 1.2 | 38 | 43.692 | 2.0717 | 4.4 |
| 6 | 14.465 | 6.1149 | 3.7 | 39 | 44.944 | 2.0169 | 10.7 |

-continued

| NO | 2THETA | D | INTEG.I (%) | NO | 2THETA | D | INTEG.I (%) |
|---|---|---|---|---|---|---|---|
| 7 | 16.834 | 5.2666 | 2.5 | 40 | 45.861 | 1.9766 | 6.8 |
| 8 | 18.512 | 4.7928 | 33.2 | 41 | 47.734 | 1.9053 | 25.7 |
| 9 | 18.990 | 4.6731 | 21.1 | 42 | 48.952 | 1.8607 | 16.0 |
| 10 | 20.337 | 4.3667 | 2.2 | 43 | 49.250 | 1.8501 | 6.1 |
| 11 | 21.276 | 4.1760 | 4.8 | 44 | 49.756 | 1.8325 | 4.0 |
| 12 | 21.769 | 4.0768 | 6.7 | 45 | 50.662 | 1.8012 | 8.2 |
| 13 | 22.251 | 3.9951 | 1.9 | 46 | 51.601 | 1.7609 | 36.4 |
| 14 | 24.139 | 3.6868 | 30.1 | 47 | 51.795 | 1.7651 | 1.2 |
| 15 | 24.758 | 3.5960 | 3.2 | 48 | 52.226 | 1.7514 | 9.7 |
| 16 | 25.654 | 3.4459 | 54.5 | 49 | 53.099 | 1.7247 | 10.3 |
| 17 | 26.711 | 3.3373 | 12.1 | 50 | 53.823 | 1.7032 | 1.9 |
| 18 | 28.011 | 3.1854 | 100.0 | 51 | 54.565 | 1.6616 | 9.7 |
| 19 | 28.561 | 3.1231 | 3.3 | 52 | 55.183 | 1.6644 | 3.5 |
| 20 | 28.933 | 3.0860 | 42.6 | 53 | 56.054 | 1.6406 | 2.2 |
| 21 | 29.282 | 3.0499 | 14.8 | 54 | 56.798 | 1.6209 | 15.7 |
| 22 | 29.704 | 3.0076 | 34.7 | 55 | 57.406 | 1.6051 | 1.6 |
| 23 | 30.396 | 2.9406 | 27.4 | 56 | 56.490 | 1.5760 | 8.0 |
| 24 | 31.683 | 2.8241 | 9.3 | 57 | 59.170 | 1.5614 | 1.1 |
| 25 | 32.794 | 2.7309 | 1.4 | 58 | 60.021 | 1.5413 | 3.9 |
| 26 | 33.416 | 2.6814 | 47.6 | 59 | 60.710 | 1.5255 | 5.2 |
| 27 | 34.148 | 2.6256 | 3.5 | 60 | 61.844 | 1.5002 | 3.5 |
| 28 | 34.889 | 2.5716 | 5.1 | 61 | 62.697 | 1.4618 | 1.5 |
| 29 | 35.716 | 2.5139 | 16.6 | 62 | 63.576 | 1.4634 | 1.9 |
| 30 | 36.278 | 2.4762 | 2.6 | 63 | 65.593 | 1.4232 | 2.1 |
| 31 | 37.471 | 2.4001 | 2.1 | 64 | 66.536 | 1.4053 | 3.7 |
| 32 | 38.139 | 2.3595 | 9.7 | 65 | 67.462 | 1.3683 | 3.8 |
| 33 | 38.926 | 2.3136 | 23.9 | 66 | 66.466 | 1.6700 | 9.2 |
|  |  |  |  | 67 | 69.600 | 1.3506 | 2.5 |

What is claimed is:

1. A black crystal composition having the empirical composition $Bi_2Sr_yCu_{3-y+k}O_f$, where
    k denotes a number between $-0.05$ and $+0.05$ and
    y denotes a number between 1 and 2.5, and
    f is approximately $6+k$ having a superconducting transition temperature $T_c$ for superconductivity of at least about 40K and a principal phase which crystallizes in the orthorhombic system.

2. A crystal composition as claimed in claim 1, where y denotes a number between 1.333 and 2.1.

3. A crystal composition as claimed in claim 1, wherein $k=0$.

4. The black crystal composition as claimed in claim 1 wherein
    y denotes a number between 1.33 and 2.25.

5. The black crystal composition as claimed in claim 2 wherein
    y denotes a number between 1.95 and 2.05.

* * * * *